(12) United States Patent
Miya

(10) Patent No.: US 7,724,107 B2
(45) Date of Patent: May 25, 2010

(54) PHASE SHIFTER HAVING SWITCHABLE SIGNAL PATHS WHERE ONE SIGNAL PATH INCLUDES NO SHUNT CAPACITOR AND INDUCTOR

(75) Inventor: Tatsuya Miya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 89 days.

(21) Appl. No.: 12/015,859

(22) Filed: Jan. 17, 2008

(65) Prior Publication Data
US 2008/0180189 A1    Jul. 31, 2008

(30) Foreign Application Priority Data
Jan. 31, 2007    (JP)    ............... 2007-021725

(51) Int. Cl.
*H03H 7/20*    (2006.01)
(52) U.S. Cl. .................. 333/139; 333/164; 333/156
(58) Field of Classification Search ............... 333/164, 333/139, 138, 156
See application file for complete search history.

(56) References Cited

U.S. PATENT DOCUMENTS

| 3,231,837 | A  | * | 1/1966  | O'Meara ..................... 333/32 |
| 5,519,349 | A  | * | 5/1996  | Nakahara ................... 327/237 |
| 6,664,870 | B2 | * | 12/2003 | Lampen et al. ............ 333/164 |
| 6,806,792 | B2 | * | 10/2004 | Penn ......................... 333/164 |
| 2006/0001507 | A1 | * | 1/2006 | Nakamura ................. 333/164 |

FOREIGN PATENT DOCUMENTS

| JP | 7-38304 A    | 2/1995 |
| JP | 2679331 B2   | 8/1997 |
| JP | 11-195960 A  | 7/1999 |

* cited by examiner

*Primary Examiner*—Benny Lee
(74) *Attorney, Agent, or Firm*—Sughrue Mion, PLLC

(57) ABSTRACT

A phase shifter includes a first signal path in which a first unit is disposed to advance a phase of a signal; a second signal path in which a second unit with no shunt capacitor is disposed to change the phase of the signal such that the changed phase is delayed than the advanced phase by the first unit; and a switch section configured to switch between the first signal path and said second signal path. The first unit comprises a filter, and the second unit is a transmission line.

14 Claims, 5 Drawing Sheets

PHASE SHIFTER HAVING SWITCHABLE SIGNAL PATHS WHERE ONE SIGNAL PATH INCLUDES NO SHUNT CAPACITOR AND INDUCTOR

BACKGROUND OF THE INVENTION

1. Field of the Invention

The present invention relates to a phase shifter and a bit phase shifter using the same. This Patent Application claims priority based on Japanese Patent application No. 2007-021725. The disclosure of the Japanese Patent application is incorporated herein by reference.

2. Description of Related Art

The phased array technique has been used for special purposes such as a radar and is used in commercial products in recent years. Application of the technique is further considered to receive satellite broadcasting. A phase shifter is indispensable to use of the phased array technique. In accordance with extension of application fields of the phased array technique, a demand is increasing for an inexpensive phase shifter suitable for commercial products and a satisfactory phase shifter having excellent high-frequency performance and suitable for receiving satellite broadcasting. However, it is difficult in a conventional phase shifter to satisfy requirement for the inexpensive phase shifter and requirement for the phase shifter with excellent high-frequency performance.

As a switching type of phase shifter used in a microwave band, an HPFLPF (high pass filter and low pass filter) switching type of phase shifter, or a switched line type of phase shifter are known. Japanese Patent No. 2679331 (first conventional example) describes a representative example of the HPFLPF switching type of phase shifter, and Japanese Laid Open Patent Application (JP-A-Heisei 7-38304) (second conventional example) describes a representative example of the switched line type of phase shifters.

FIG. 1 is a circuit diagram of an HPFLPF switching type of phase shifter. Referring to FIG. 1, the HPFLPF switching type of phase shifter includes an input-side SPDT (single pole double throw) switch 100, an HPF (high pass filter) 110, an LPF (low pass filter) 112, and an output-side SPDT switch 102.

The input-side SPDT switch 100 has an FET (field effect transistor) F10 connected to a first signal path, and an FET F11 connected to a second signal path. In the input-side SPDT switch 100, control voltages are applied to a control terminal CON 10 and a control terminal CON11 in a complementary manner, respectively. That is, an OFF voltage is applied to the control terminal CON11 when an ON voltage is applied to the control terminal CON10, and the ON voltage is applied to the control terminal CON11 when the OFF voltage is applied to the control terminal CON10. Accordingly, the FET F11 is in an off state when the FET F10 in an on state, and the FET F11 is in an on state when the FET F10 is in an off state.

The output-side SPDT switch 102 has an FET F12 connected to the first signal path, and an FET F13 connected to the second signal path. In the output-side SPDT switch 102, control voltages are applied to a control terminal CON12 and a control terminal CON13 in a complementary manner, respectively. Since an OFF voltage is applied to the control terminal CON13 when an ON voltage is applied to the control terminal CON12, the FET F13 is in an off state when the FET F12 is in an on state. Moreover, the ON voltage is applied to the control terminal CON13 when the OFF voltage is applied to the control terminal CON12, so that the FET F13 is in an on state when the FET F12 is in an off state.

The same control voltages are applied to the control terminal CON10 of the input-side SPDT switch 100 and the control terminal CON12 of the output-side SPDT switch 102. Accordingly, the FET F12 of the output-side SPDT switch 102 is turned on when the FET F10 of the input-side SPDT switch 100 is turned on. At this time, the first signal path is selected. The same control voltages are also applied to the control terminal CON11 of the input-side SPDT switch 100 and the control terminal CON13 of the output-side SPDT switch 102. Accordingly, the FET F13 of the output-side SPDT switch 102 is turned on when the FET F11 of the input-side SPDT switch 100 is turned on, and in this case the second signal path is selected.

The HPF 110 is disposed in the first signal path. The HPF 110 has a shunt inductor L10 connected to a ground, and two series-connected capacitors C10 and C11 are disposed to put the inductor L10 between them. On the other hand, the LPF 112 is disposed in the second signal path. The LPF 112 has a shunt capacitor C12 connected to a ground, and two series-connected inductors L11 and L12 are disposed to put the capacitor C12 between them.

When the ON voltages are applied to the control terminal CON10 and the control terminal CON12, and when the OFF voltages are applied to the control terminal CON11 and the control terminal CON13, a signal is inputted from an input terminal IN10 and is outputted from an output terminal OUT10 via the HPF 110. At this time, the signal passes through the HPF 110, and thereby the phase is advanced. Meanwhile, when the OFF voltages are applied to the control terminal CON10 and the control terminal CON12, and when the ON voltages are applied to the control terminal CON11 and the control terminal CON13, the signal inputted from the input terminal IN10 is outputted from the output terminal OUT10 via the LPF 112. At this time, the signal passes through the LPF 112 and thereby its phase is delayed.

In the HPFLPF switching type of phase shifter, the signal path connected to the HPF 110 and the signal path connected to the LPF 112 are switched by the SPDT switches 100 and 102, so that a phase shift amount corresponding to a phase difference between the two signal paths can be obtained. An arbitrary phase shift amount can be obtained by selecting the capacitors C10, C11 and C12 and the inductors L10, L11 and L12 to constitute the HPF 110 and the LPF 112, respectively. In a designed frequency band, a phase is advanced on an HPF 110 side, and the phase is delayed on an LPF 112 side. For example, if it is designed so that the phase on the HPF 110 side is advanced by 22.5 degrees and the phase on the LPF 112 side is delayed by 22.5 degrees at the designed frequency band, a phase shift amount of 45 degrees can be obtained.

FIG. 2 is a block diagram showing a configuration of another conventional phase shifter which is generally called a switched line type of phase shifter. Referring to FIG. 2, the switched line type of phase shifter includes an input-side SPDT switch 104, a first transmission line 120, a second transmission line 122, and an output-side SPDT switch 106.

In FIG. 2, when ON voltages are applied to a control terminal CON14 and a control terminal CON16, and when OFF voltages are applied to a control terminal CON15 and a control terminal CON17, an FET F14 and an FET F16 are turned on, and an FET F15 and an FET F17 are turned off. At this time, a signal is inputted from an input terminal IN11 and is outputted from an output terminal OUT11 via the transmission line 120. Meanwhile, when the OFF voltages are applied to the control terminal CON14 and the control terminal CON16, and when the ON voltages are applied to the control terminal CON15 and the control terminal CON17, the FET F14 and the FET F16 are turned off, and the FET F15 and the FET F17 are turned on. At this time, the signal is inputted from the input terminal IN11 and is outputted from the output terminal OUT11 via the transmission line 122.

The signal paths are operationally switched through on/off control of the SPDT switches 104 and 106 in the same manner as in the circuit shown in FIG. 1. In the switched line type of phase shifter, a phase difference between the two signal paths can be obtained as a phase shift amount. The transmission lines 120 and 122 having different lengths are connected to the respective signal paths, and in this case, the difference between phases of the signals due to different line lengths is utilized. Since the both of the signal paths have phase delays, it is assumed that the transmission line 120 has a length to delay the phase by 10 degrees in the designed frequency band, and the transmission line 122 has a length to delay the phase by 55 degrees. At this time, the phase shift amount of 45 degrees can be obtained.

As described above, a pair of HPF 110 and LPF 112 is used in the HPFLPF switching type of phase shifter and a pair of the transmission lines 120 and 122 having different lengths is used in the switched line type of phase shifter. Other phase shifters used in a millimeter wave band include a known phase shifter described in Japanese Patent Application Publication (JP-A-Heisei 11-195960) (third conventional example). The phase shifter described in the third conventional example relates to a phase shifter in a millimeter wave band in which SPDT switch characteristics cannot be obtained, so that a signal switch is not used. Thus, it is different from phase shifters of the HPFLPF switching type and the switched line type used in a microwave band. It should be noted that since many quarter-lines (four lines at minimum) are used in the phase shifter in the third conventional example, a chip size is increased. Therefore, it is extremely difficult to fabricate an inexpensive phase shifter.

A phase shifter can be configured by using either one of the conventional phase shifters, i.e. the HPFLPF switching type of phase shifter or the switched line type of phase shifter, without having any problems in the most cases. However, problems arise depending on a specific frequency band to be used and a phase shift amount.

If the phase shift amount is made smaller in the HPFLPF switching type of phase shifter, a phase shift amount advanced in a HPF and a phase shift amount delayed in an LPF need to be made smaller. In order to decrease the phase shift amounts of the filters, capacitors and inductors to constitute the filters need to have small constants. The LPF is configured of the series of inductors and the shunt capacitor, in which constants of these elements are made smaller in case of decreasing the phase shift amount. However, it is not possible in the shunt capacitor to ignore effect of a parasitic inductance caused by extending a wiring pattern in a high frequency band. Therefore, it is difficult to use small capacitance of a shunt capacitor. In order to realize a small capacitance of the shunt capacitor, problems arise such as increase of factors to process variations and increase of a phase shift error. Accordingly, frequency characteristics need to be sacrificed to some extent in case of the HPFLPF switching type of phase shifter having a small phase shift amount for the high frequency band.

Meanwhile, in the case of the switched line type of phase shifter, a large difference in the line length is required for a large phase shift amount. Accordingly, there are drawbacks such as arrangement of a long transmission line and an increased chip size. As a result, the cost increases. An influence of the larger line difference on frequency characteristics of a phase shifter increases.

The above problems occur in both the HPFLPF type of phase shifter and the switched line type of phase shifter, when a phase shift amount is set to be 20 to 45 degrees in the frequency band of about 10 to 15 GHz. Therefore, either frequency characteristics or costs are sacrificed in the conventional phase shifters.

SUMMARY OF THE INVENTION

In a first aspect of the present invention, a phase shifter includes a first signal path in which a first unit is disposed to advance a phase of a signal; a second signal path in which a second unit with no shunt capacitor is disposed to change the phase of the signal such that the changed phase is delayed phase by the first unit; and a switch section configured to switch between the first signal path and said second signal path. The first unit comprises a filter, and the second unit is a transmission line.

In another aspect of the present invention, a bit phase shifter includes a plurality of phase shifters. One of the phase shifters includes a first signal path in which a first unit is disposed to advance a phase of a signal; a second signal path in which a second unit with no shunt capacitor is disposed to change the phase of the signal such that the changed phase is delayed; and a switch section configured to switch between the first signal path and said second signal path.

According to the present invention, a phase shifter with excellent frequency characteristics in high frequencies can be provided, and an inexpensive phase shifter can also be provided. Moreover, various kinds of phase shifters can be fabricated.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Hereinafter, a phase shifter according to embodiments of the present invention will be described in detail with reference to the attached drawings.

Figure 1:
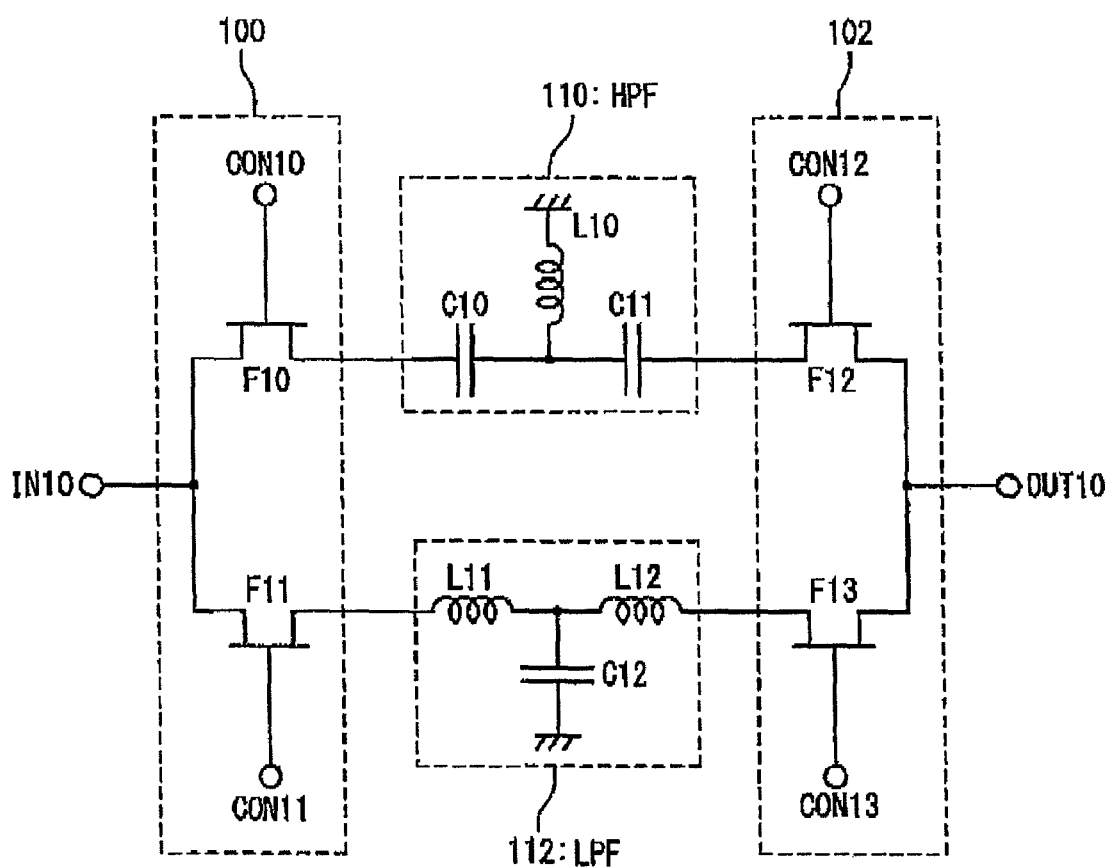
FIG. 1 is a configuration diagram of a phase shifter of an HPFLPF switching type.
Figure 2:
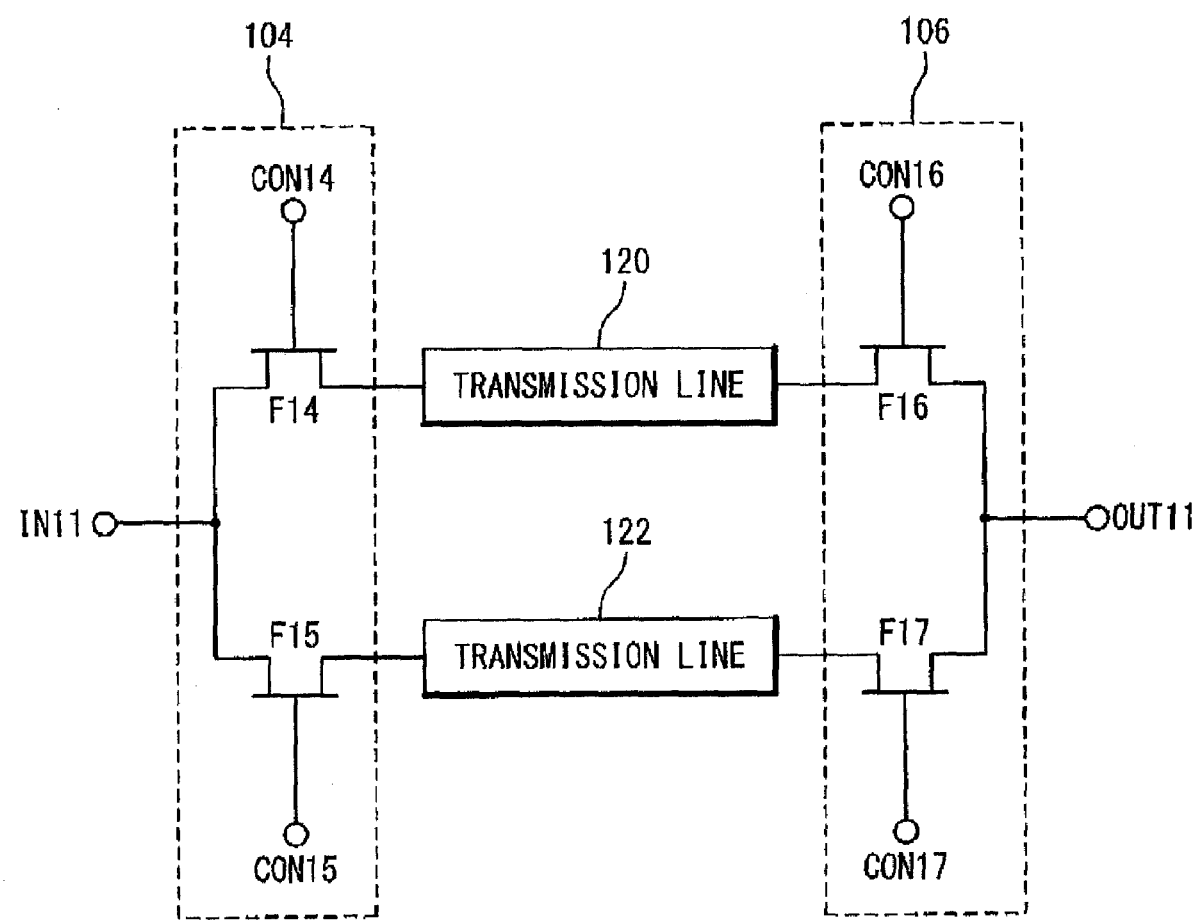
FIG. 2 is a configuration diagram of a phase shifter of a switched line type.
Figure 3:
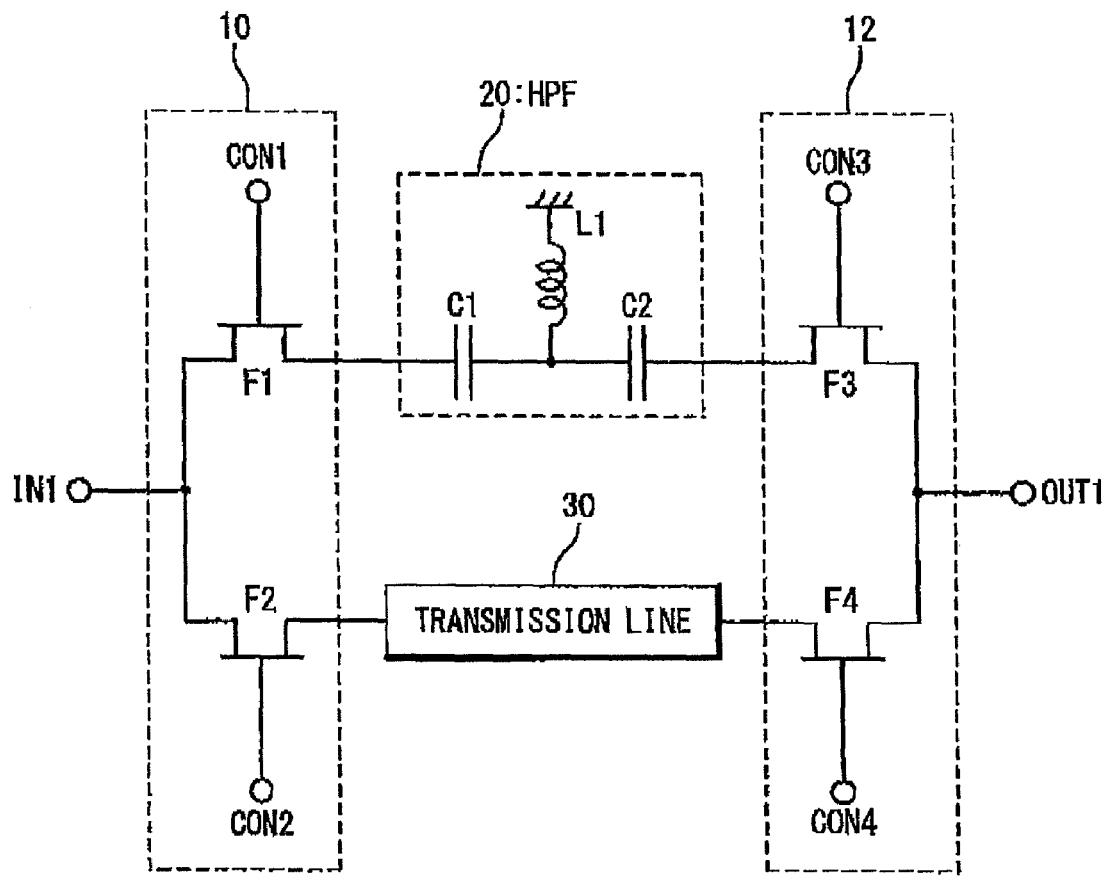
FIG. 3 is a diagram showing a basic configuration of the best mode to carry out the present invention.

FIG. 3 shows a basic configuration of the phase shifter according to a first embodiment of the present invention. In the first embodiment, switches 10 and 12 for switching signal paths are provided, and a high pass filter (HPF) 20 is arranged in one of the signal paths and a microstrip transmission line 30 is arranged in the other signal path.

An operation of the phase shifter according to the present embodiment will be described with reference to FIG. 3. In FIG. 3, when ON voltages are applied to a control terminal CON1 and a control terminal CON3, and OFF voltages are applied to a control terminal CON2 and a control terminal CON4, an FET F1 and an FET F3 are turned on, and an FET F2 and an FET F4 are turned off. At this time, a microwave signal is inputted from an input terminal IN1 and is outputted from an output terminal OUT1 via the HPF 20, which includes series-connected capacitors C1 and C2 and an inductor L1. Meanwhile, when the OFF voltages are applied to the control terminal CON1 and the control terminal CON3, and the ON voltages are applied to the control terminal CON2 and the control terminal CON4, the FET F1 and the FET F3 are turned off, and the FET F2 and the FET F4 are turned on. At this time, when being inputted from the input terminal IN1, the microwave signal is outputted from the output terminal OUT1 via the transmission line 30.

In the present embodiment, the signal path provided with the HPF 20 and the signal path provided with the transmission line 30 are switched by the SPDT switches 10 and 12. Therefore, a phase difference between these signal paths can be obtained as a phase shift amount. A phase of a signal of a design frequency is advanced in the signal path on the HPF 20 side, while the phase of the signal is delayed by a value corresponding to a line length in the signal path on the transmission line 30 side. If it is designed to advance a phase by 22.5 degrees on the HPF 20 side and to delay a phase by 22.5 degrees on the transmission line 30 side, a total phase shift amount of 45 degrees can be obtained.

Although a shunt capacitor causes a problem in realizing a small phase shift amount in high frequency band, the shunt capacitor need not to be arranged in the present embodiment, because the low pass filter (LPF) 112 can be omitted in the present embodiment. As a result, even if a phase shifter is configured to obtain a small phase shift amount in a high frequency band, excellent designability and variation property can be attained. It should be noted that the LPF 112 using the shunt capacitor may be used if the phase shift amount is larger.

The transmission line is used in the present embodiment. The phase shift amount can be obtained as a phase difference between the advanced phase in the HPF 20 and the delayed phase in the transmission line 30 in the present embodiment, while the phase shift amount is obtained as a difference between the delayed phases in the switched line type phase shifter. Accordingly, a line length to obtain a same phase shift amount can be made shorter than that of the switched line type. For example, a transmission line having a length to delay a phase by 55 degrees is required to obtain the phase shift amount of 45 degrees in the switched line type, as described above. On the contrary, in the above example of the present embodiment, the phase shift amount of 45 degrees can be obtained by using a transmission line to delay a phase by 22.5 degrees. In this manner, the line length of the transmission line used in the present embodiment may be less than a half of the line length required to obtain the same phase shift amount in the switched line type. Accordingly, a chip size can be made smaller significantly.

As described above, a shunt capacitor of a small capacitance is not required in the configuration of a phase shifter of a relatively small phase shift amount in the high frequency band, although the shunt capacitor is difficult to realize and its characteristics are largely influenced through process variations. As a result, the phase shifter with excellent designability and less variation can be fabricated. Moreover, the HPF allows the line length of the used transmission line to be the line length of a transmission line for 22.5 degrees which is about a half of the line length of the transmission line for 55 degrees in the switched line type, so that a miniaturized chip size can be realized. A configuration can be realized with a chip size which is about a half of a chip size of the phase shifter of the conventional switched line type and equivalent to or smaller than that of the HPFLPF switching type.

Figure 4:
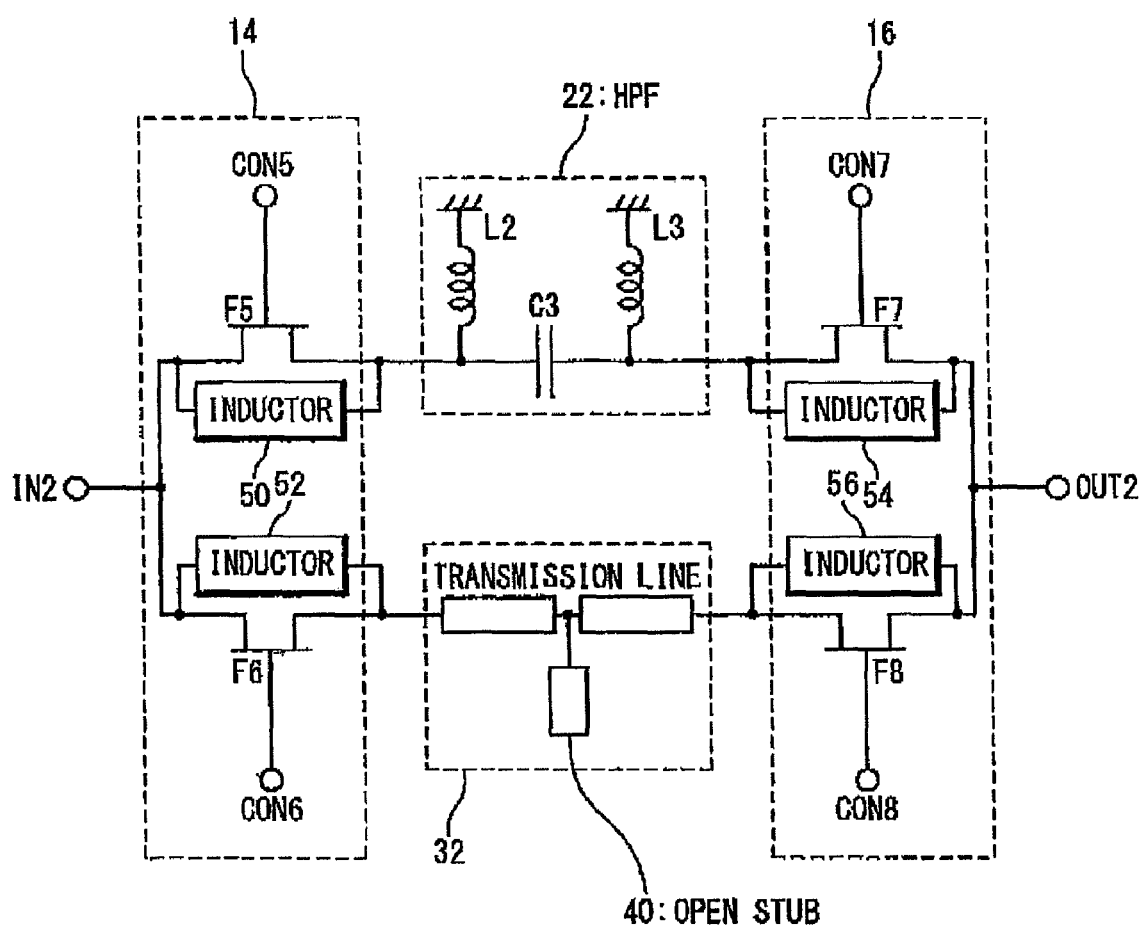
FIG. 4 is a diagram showing a detailed application example of the present embodiment.

FIG. 4 shows the phase shifter according to a second embodiment of the present invention. The phase shifter in FIG. 4 has an input-side SPDT switch 14 which is connected to the terminal IN2, an HPF 22 provided in a first path, a transmission line 32 provided in a second path, and an output-side SPDT switch 16 which is connected to the terminal OUT2.

The input-side SPDT switch 14 has an FET F5 connected to the first signal path, and an FET F6 connected to the second signal path. Inductors 50 and 52 resonate with the FET F5 and the FET F6 functioning as capacitors when OFF voltages are applied to gate electrodes, respectively. Control voltages are applied to a control terminal CON5 and a control terminal CON7 in a complementary manner. The output-side SPDT switch 16 has an FET F7 connected to the first signal path and an FET F8 connected to the second signal path. Inductors 54 and 56 resonate with the FET F7 and the FET F8 functioning as capacitors when OFF voltages are applied to the gate electrodes, respectively. Control voltages are applied to the control terminal CON7 and the control terminal CON8 in a complementary manner. As shown in FIG. 4, the input-side SPDT switch 14 and the output-side SPDT switch 16 are both made to be resonance switches, in which the FETs F5, F6, F7 and F8 are respectively connected in parallel with the inductors 50, 52, 54 and 56 between the drains and the sources, respectively. In order to switch the signal paths, same control voltages are applied to the control terminal CON5 of the input-side SPDT switch 14 and the control terminal CON7 of the output-side SPDT switch 16, while same control voltages are also applied the control terminal CONE of the input-side SPDT switch 14 and the control terminal CON8 of the output-side SPDT switch 16.

In FIG. 4, the HPF 22 is disposed in the first signal path. The HPF 22 has a capacitor C3 provided in series and shunt inductors L2 and L3 connected to a ground. The HPF 22 shown in FIG. 4 has a circuit configuration which is slightly different from that of the HPF 20 of FIG. 3. Meanwhile, the transmission line 32 is connected to the second signal path. The transmission line 32 is configured to have an open stub 40. The open stub 40 functions as a characteristic adjustment circuit. The phase shifter of FIG. 4 is configured to switch the signal path for the HPF and the signal path for the transmission line by the switches in the same manner as the phase shifter of FIG. 3. Accordingly, a circuit operation in the phase shifter of FIG. 4 is similar to that of the phase shifter of FIG. 3, in which similar effects can be obtained.

In addition to the resonance switches shown in FIG. 4, switches for switching signals such as a switch of a series shunt type and a switch using diodes other than FETs can be applied to the SPDT switch in the present embodiment. The HPF on the signal path may be an HPF to obtain a plurality of phases using variable capacitance elements and variable resistance elements made by FETs and diodes, in addition to the HPF having various combinations of capacitors and inductors. The HPF is sufficient to advance a phase in a design frequency. The transmission line may also be realized by applying a transmission line to delay a phase by a configuration of a distributed constant circuit such as a microstrip line, even if there are a characteristic impedance difference and a shape difference due to stubs.

As shown in FIGS. 3 and 4, the phase shifter according to the embodiments of the present invention is essentially configured of a pair of a filter which is composed of inductors and a capacitor and allows a phase to advance in the design frequency, and a transmission line which is a member other than the filter and allows the phase to delay. Accordingly, various kinds of modifications could be considered in realizing the phase shifter according to the present embodiment in practice.

The microwave band phase shifter configured to switch between the HPF and the transmission line by the switches has been described above. Moreover, a microwave band phase shifter configured to switch a first HPF and a second HPF by switches can also be considered. In this case, although being not shown, the HPF 20 or 22 may be used instead of the transmission line 30 or 32. It should be noted that the HPF instead of the transmission line changes the phase of the signal transmitted on the second signal path such that the changed phase is delayed. If a difference is provided between a phase advanced in the first HPF and a phase advanced in the second HPF, a desired phase shift amount can be obtained. Since an LPF is not used, the shunt capacitor is not required, which allows fabrication of the phase shifter with excellent high frequency characteristics. Depending on the design frequency, a phase shifter may be configured to switch between the first LPF and the second LPF by switches, and a phase shifter may be configured to switch the LPF and a transmission line by switches. A phase shifter with a third signal path added to the above phase shifter can also be considered.

Figure 5:
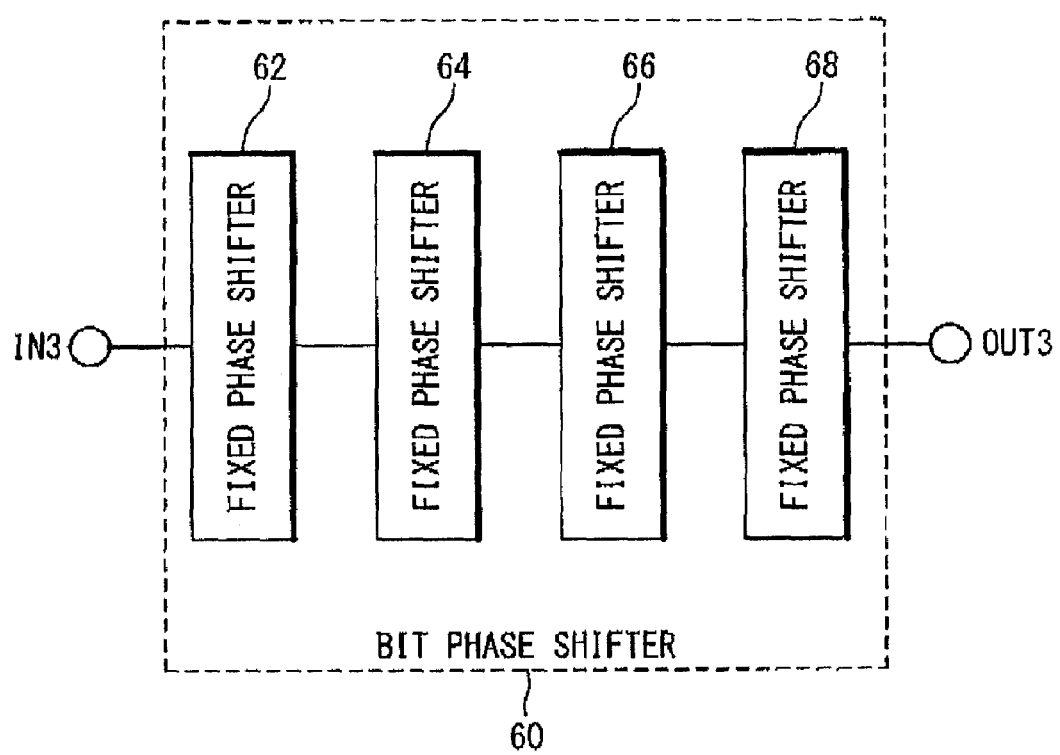
FIG. 5 is a diagram showing a bit phase shifter including the phase shifter according to the present embodiment.

FIG. 5 is a diagram showing a bit phase shifter including the phase shifters according to the present embodiment. In FIG. 5, four phase shifters 62, 64, 66 and 68 having predetermined or fixed phase shift amounts are arranged in cascade to constitute a bit phase shifter 60. For example, it is assumed that the phase shifter 62 has the phase shift amount of 22.5 degrees, the phase shifter 64 has the phase shift amount of 45 degrees, the phase shifter 66 has the phase shift amount of 90 degrees, and the phase shifter 68 has the phase shift amount of 180 degrees. If digital data "1000" is supplied to the bit phase shifter 60 at this time, the phase shifter 62 is allowed to obtain the phase shift amount of 22.5 degrees, and a microwave signal is inputted from an input terminal IN3 and is outputted from an output terminal OUT3 to have the phase shift amount of 22.5 degrees. Similarly, if digital data "0100" is supplied, the phase shifter 64 is allowed to obtain the phase shift amount of 45 degrees. If digital data "1100" is supplied, the phase shift amount of 67.5 degrees is obtained as a sum of the phase shift amount of 22.5 degrees by the phase shifter 62 and the phase shift amount of 45 degrees by the phase shifter 64. If digital data "1111" is supplied, the phase shift amount of 337.5 degrees can be obtained as a sum of the phase shift amount of 22.5 degrees by the phase shifter 62, the phase shift amount of 45 degrees by the phase shifter 64, the phase shift amount of 90 degrees by the phase shifter 66, and the phase shift amount of 180 degrees by the phase shifter 68.

According to the phase shifter of the present embodiment, problems in the conventional HPFLPF switching type of phase shifter and the switched line type of phase shifter can be solved in case of realizing a specific phase shift amount. Accordingly, an application of the present embodiment is considered to an internal portion of the bit phase shifter 60 which is unable to constitute by the conventional phase shifters. For example, the phase shifter 62 of the present embodiment is made as the phase shifter configured to switch the HPF and the transmission line by the switches, and the remaining phase shifters 64, 66 and 68 may be made as phase shifters of the HPFLPF switching type. When the bit phase shifter is fabricated in practice, the phase shifters according to the present embodiment may be applied to the entire phase shifters. That is, the entire phase shifters 62, 64, 66 and 68 may be the phase shifter according to the present embodiment.

As described above, in the switching type of microwave band phase shifter to obtain a phase shift amount by switching two signal paths, an HPF is provided in one of the signal paths and a transmission line is provided in the other signal path. Therefore, it is made possible to solve the conventional problems in the HPFLPF switching type of phase shifters and the switched line type of phase shifters, so that a microwave band phase shifter which is inexpensive and has excellent frequency characteristics can be provided.

Although the inventions has been described above in connection with several preferred embodiments thereof, it will be appreciated by those skilled in the art that those embodiments are provided solely for illustrating the invention, and should not be relied upon to construe the appended claims in a limiting sense.

The SPDT switch switches between the first and second signal paths by controlling MOS transistors or diodes. That is, the first switch section may include a first MOS transistor connected to said first signal path and second MOS transistor connected to the second signal paths and the second switch section includes a third MOS transistor connected to the first signal path and a fourth MOS transistor connected to the second signal path.

What is claimed is:

1. A phase shifter comprising:
 a first signal path in which a first unit is disposed to advance a phase of a signal;
 a second signal path in which a second unit with no shunt capacitor and no inductor is disposed to change the phase of the signal such that the changed phase is delayed; and
 a switch section configured to switch between said first signal path and said second signal path.

2. The phase shifter according to claim 1, wherein said first unit comprises a filter.

3. The phase shifter according to claim 2, wherein said filter is a high pass filter.

4. The phase shifter according to claim 3, wherein said high pass filter comprises:
 first and second capacitances connected in series; and
 an inductance connected from a node between said first and second capacitances to a ground.

5. The phase shifter according to claim 3, wherein said high pass filter comprises:
 a capacitance disposed in said first signal path; and
 first and second inductances connected from ends of said capacitance to a ground, respectively.

6. The phase shifter according to claim 1, wherein said switch section comprises:
 a first switch section connected to an input terminal and said first and second signal paths; and
 a second switch section connected to an output terminal and said first and second signal paths.

7. The phase shifter according to claim 6, wherein each of said first and second switch sections comprises a single pole double throw (SPDT) switch.

8. A phase shifter comprising:
 a first signal path in which a first unit is disposed to advance a phase of a signal;
 a second signal path in which a second unit with no shunt capacitor is disposed to change the phase of the signal such that the changed phase is delayed; and a switch section configured to switch between said first signal path and said second signal path, wherein said second unit comprises a transmission line.

9. The phase shifter according to claim 8, wherein said transmission line is a microstrip line.

10. The phase shifter according to claim 8, wherein said second unit further comprises the transmission line with an open stub.

11. A phase shifter comprising:

a first signal path in which a first unit is disposed to advance a phase of a signal;

a second signal path in which a second unit with no shunt capacitor is disposed to change the phase of the signal such that the changed phase is delayed; and a switch section configured to switch between said first signal path and said second signal path, wherein the delay of the changed phase is a function of length of the second signal path.

12. A bit phase shifter comprising a plurality of phase shifters, wherein one of said phase shifters comprises:

a first signal path in which a first unit is disposed to advance a phase of a signal;

a second signal path in which a second unit with no shunt capacitor is disposed to change the phase of the signal such that the changed phase is delayed than the advanced phase by said first unit; and a switch section configured to switch between said first signal path and said second signal path, and wherein said second unit comprises a microstrip transmission line.

13. A bit phase shifter comprising a plurality of phase shifters, wherein one of said phase shifters comprises:

a first signal path in which a first unit is disposed to advance a phase of a signal; a second signal path in which a second unit with no shunt capacitor and no inductor is disposed to change the phase of the signal such that the changed phase is delayed; and a switch section configured to switch between said first signal path and said second signal path.

14. The phase shifter according to claim 13, wherein said first unit comprises a high pass filter.

* * * * *